US008927941B2

(12) United States Patent
Touya et al.

(10) Patent No.: US 8,927,941 B2
(45) Date of Patent: Jan. 6, 2015

(54) MULTI CHARGED PARTICLE BEAM WRITING APPARATUS AND MULTI CHARGED PARTICLE BEAM WRITING METHOD WITH FIXED VOLTAGE RATIO EINZEL LENS

(71) Applicant: NuFlare Technology, Inc., Numazu-shi (JP)

(72) Inventors: Takanao Touya, Kanagawa (JP); Shuichi Tamamushi, Kanagawa (JP); Munehiro Ogasawara, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/763,976

(22) Filed: Feb. 11, 2013

(65) Prior Publication Data

US 2013/0240750 A1 Sep. 19, 2013

(30) Foreign Application Priority Data

Mar. 19, 2012 (JP) ................................ 2012-062437

(51) Int. Cl.

*H01J 37/22* (2006.01)
*H01J 37/317* (2006.01)
*H01J 37/30* (2006.01)
*H01J 37/145* (2006.01)
*H01J 37/153* (2006.01)

(52) U.S. Cl.

CPC ........... *H01J 37/3007* (2013.01); *H01J 37/145* (2013.01); *H01J 37/3177* (2013.01); *H01J 37/153* (2013.01); *H01J 2237/21* (2013.01)
USPC ...................................................... 250/396 R

(58) Field of Classification Search

CPC ................ H01J 37/153; H01J 37/3177; H01J 2237/1207
USPC ........................................................ 250/396
See application file for complete search history.

(56) References Cited

U.S. PATENT DOCUMENTS 5,293,045 A * 3/1994 Miyoshi et al. ........... 250/396 R
6,130,429 A * 10/2000 Ambe et al. .................. 250/310

(Continued)

FOREIGN PATENT DOCUMENTS

JP 2003-332206 11/2003
JP 2004-303794 A 10/2004

(Continued)

OTHER PUBLICATIONS

U.S. Appl. No. 13/706,908, Dec. 6, 2012, Yoshikawa, et al.

(Continued)

*Primary Examiner* — Phillip A Johnston
*Assistant Examiner* — Sean Luck
(74) *Attorney, Agent, or Firm* — Oblon, Spivak, McClelland, Maier & Neustadt, L.L.P.

(57) ABSTRACT

A multi charged particle beam writing apparatus according to the present invention includes an aperture member, in which a plurality of openings are formed, to form multiple beams, a blanking plate having a plurality of blankers to respectively perform blanking deflection of a corresponding beam in multiple beams having passed through the plurality of openings of the aperture member, a blanking aperture member to block each of beams which were deflected to be in a beam off state by the plurality of blankers, a plural stage objective lens to focus multiple beams having passed through the blanking aperture member onto the target object and a plurality of electrostatic lenses, at least one of which is arranged at each stage of the plural stage objective lens, to dynamically correct defocusing of the multiple beams during writing.

8 Claims, 12 Drawing Sheets

(56) References Cited

U.S. PATENT DOCUMENTS

| | | | | |
|---|---|---|---|---|
| 7,485,879 | B2 | 2/2009 | Sunaoshi et al. | |
| 7,554,107 | B2 | 6/2009 | Yoshitake et al. | |
| 7,643,130 | B2 | 1/2010 | Yoshitake et al. | |
| 7,679,068 | B2 | 3/2010 | Kamikubo et al. | |
| 7,800,084 | B2 | 9/2010 | Tamamushi et al. | |
| 7,834,333 | B2 | 11/2010 | Nishimura et al. | |
| 8,067,753 | B2 | 11/2011 | Touya | |
| 8,183,544 | B2 | 5/2012 | Tsuruta et al. | |
| 8,207,514 | B2 * | 6/2012 | Hara et al. | 250/492.22 |
| 8,229,207 | B2 | 7/2012 | Tamamushi | |
| 8,277,603 | B2 | 10/2012 | Tamamushi et al. | |
| 8,306,310 | B2 | 11/2012 | Tamamushi | |
| 8,452,074 | B2 | 5/2013 | Tamamushi | |
| 2001/0032938 | A1 | 10/2001 | Gerlach et al. | |
| 2002/0134949 | A1 * | 9/2002 | Gerlach et al. | 250/492.21 |
| 2003/0209674 | A1 * | 11/2003 | Hamaguchi et al. | 250/396 ML |
| 2005/0077475 | A1 * | 4/2005 | Nagae et al. | 250/396 R |
| 2006/0169910 | A1 * | 8/2006 | Frosien et al. | 250/396 ML |
| 2008/0067376 | A1 * | 3/2008 | Tanimoto et al. | 250/310 |
| 2010/0038537 | A1 * | 2/2010 | Benner | 250/311 |
| 2010/0074513 | A1 * | 3/2010 | Tamamushi | 382/144 |
| 2011/0068281 | A1 * | 3/2011 | Hara et al. | 250/492.22 |
| 2011/0255770 | A1 | 10/2011 | Touya et al. | |
| 2012/0193553 | A1 | 8/2012 | Touya | |
| 2013/0056645 | A1 | 3/2013 | Yoshikawa et al. | |
| 2013/0056647 | A1 | 3/2013 | Yoshikawa et al. | |
| 2013/0082187 | A1 | 4/2013 | Ogasawara | |
| 2014/0061499 | A1 | 3/2014 | Ogasawara et al. | |

FOREIGN PATENT DOCUMENTS

| | | |
|---|---|---|
| JP | 2006-261342 | 9/2006 |
| JP | 2014-49545 A | 3/2014 |
| KR | 10-2009-0024622 | 3/2009 |

OTHER PUBLICATIONS

U.S. Appl. No. 13/768,258, Feb. 15, 2013, Touya, et al.
U.S. Appl. No. 13/768,327, Feb. 15, 2013, Touya, et al.
U.S. Appl. No. 14/108,936, Dec. 17, 2013, Touya, et al.
U.S. Appl. No. 14/108,844, Dec. 17, 2013, Touya, et al.
Office Action issued Apr. 21, 2014 in Korean Patent Application No. 10-2013-0026026 (with English Translation).
Office Action and Search Report issued on Jul. 9, 2014 in the corresponding Taiwanese Patent Application No. 102106198 (with English Translation).

* cited by examiner

Rotation Angle When First Stage Applied 100V
And Second Stage Applied Variable Voltage
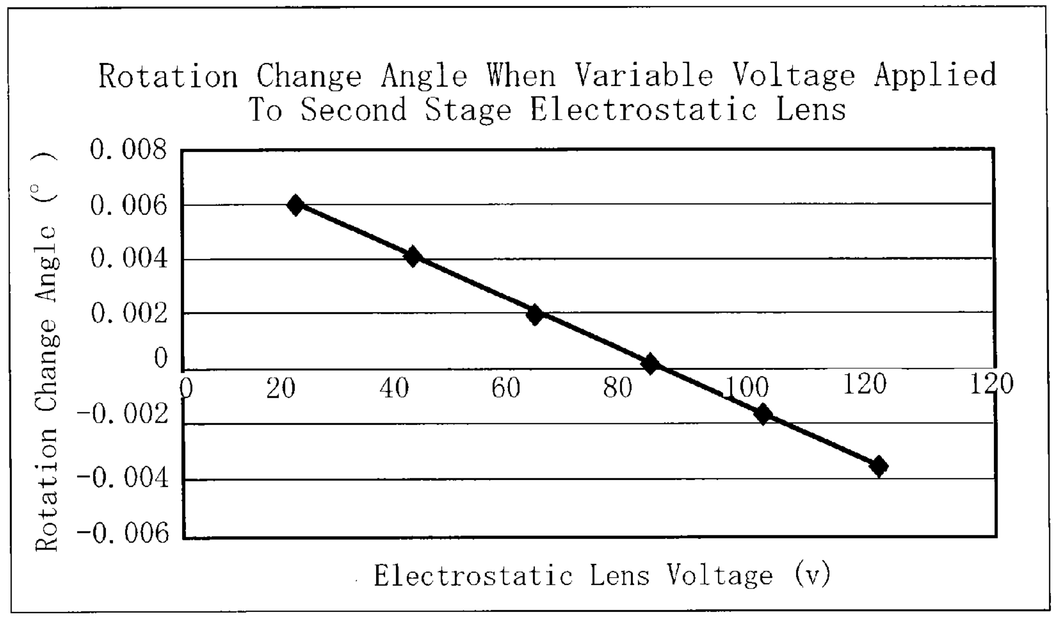
FIG. 9
FIG. 10A
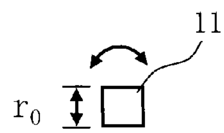
FIG. 10B
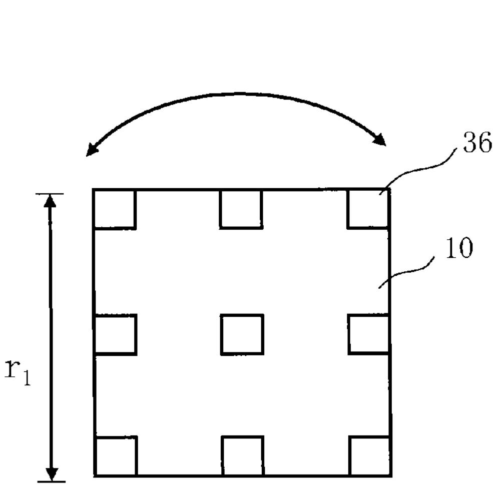

Magnification Change Rate When First Stage Applied 100V And Second Stage Applied Variable Voltage
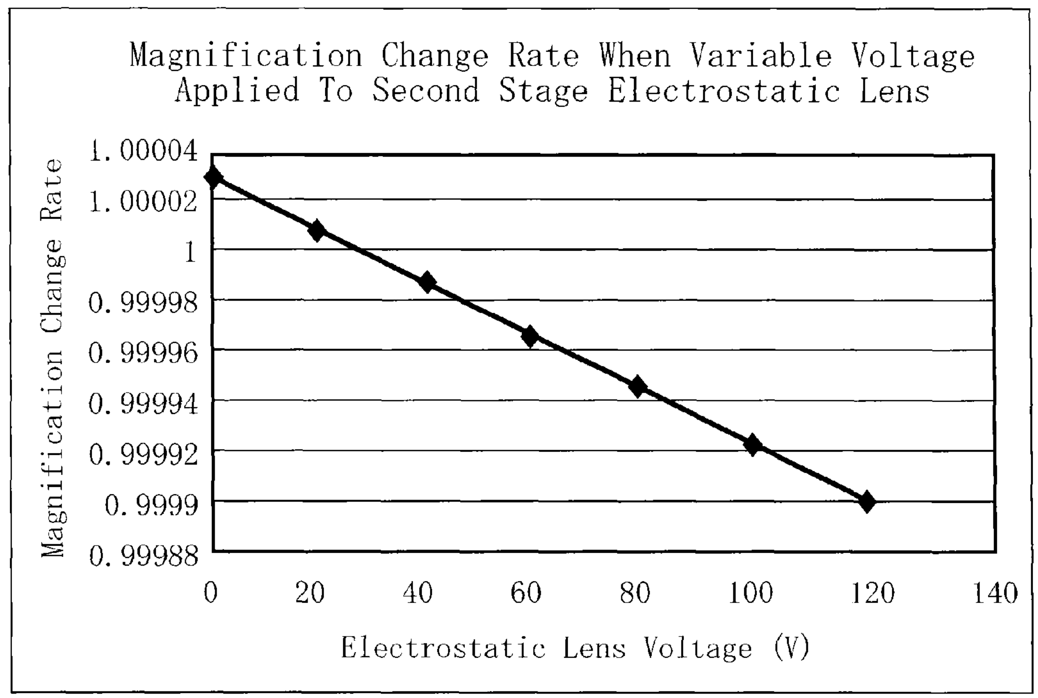
FIG. 12
FIG. 13A
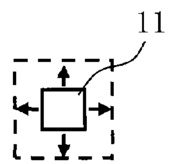
FIG. 13B
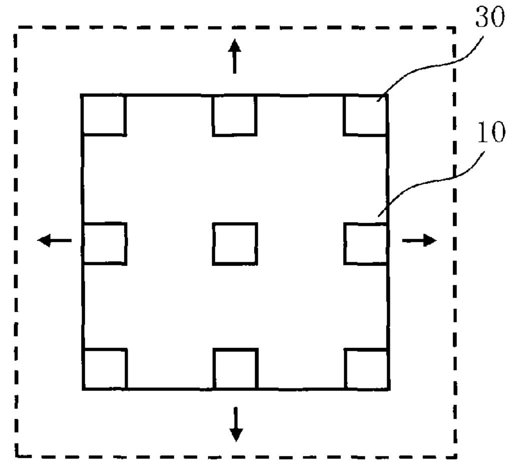

Rotation Angle And Magnification Change Rate When First Stage Applied 100V, And Second And Third Stages Applied Variable

MULTI CHARGED PARTICLE BEAM WRITING APPARATUS AND MULTI CHARGED PARTICLE BEAM WRITING METHOD WITH FIXED VOLTAGE RATIO EINZEL LENS

CROSS-REFERENCE TO RELATED APPLICATION

This application is based upon and claims the benefit of priority from the prior Japanese Patent Application No. 2012-062437 filed on Mar. 19, 2012 in Japan, the entire contents of which are incorporated herein by reference.

BACKGROUND OF THE INVENTION

1. Field of the Invention

The present invention relates to a multi charged particle beam writing apparatus and a multi charged particle beam writing method. For example, the present invention relates to a method of obtaining the high accuracy of multi-beam writing.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer, etc. with an electron beam.

As an example using the electron beam writing technique, there is a writing apparatus using multiple beams (multi-beams). Since it is possible for a multi-beam writing apparatus to perform irradiation with multiple beams at a time, throughput can be greatly increased compared with the case of writing using a single electron beam. In such a writing apparatus of a multi-beam system, for example, multiple beams are formed by letting an electron beam emitted from an electron gun assembly pass through a mask with a plurality of holes, blanking control is performed for each beam, and each of unblocked beams is reduced by an optical system and deflected by a deflector so as to irradiate a desired position on a target object or "sample" (refer to, e.g., Japanese Patent Application Laid-open (JP-A) No. 2006-261342).

In an electron beam writing apparatus, each shot beam is focused on a target object surface by an objective lens, and then focal correction (dynamic focusing) is dynamically performed during writing in order to deal with convex and concave of the target object surface by using an electrostatic lens, for example. However, when dynamic focusing is performed, rotational variation occurs in a beam image on the target object surface, and moreover, magnification change also occurs. Such problems degrade the accuracy of writing position. In the case of a single beam system, since the number of beams is one, rotational variation and magnification change will occur with respect to one shot, thereby producing a positional error that is not so large in many cases. However, in the case of a multi-beam system, as being different from the single beam system, since the number of beams of one shot which are simultaneously irradiating is a large number, if rotational variation and magnification change occur in the entire multi beams, a writing positional error may the one that cannot be allowed. Therefore, it is required to reduce as much as possible the rotational variation and magnification change of an image due to dynamic focusing. Needless to say, even in the single beam system, such a problem may become serious in the pursuit of further accuracy of writing from now on.

BRIEF SUMMARY OF THE INVENTION

In accordance with one aspect of the present invention, a multi charged particle beam writing apparatus includes a stage configured to mount a target object thereon and be movable continuously, an emission unit configured to emit a charged particle beam, an aperture member, in which a plurality of openings are formed, configured to form multiple beams by letting a region including a whole of the plurality of openings be irradiated by the charged particle beam and letting parts of the charged particle beam respectively pass through a corresponding opening of the plurality of openings, a blanking plate having a plurality of blankers configured to respectively perform blanking deflection of a corresponding beam in multiple beams having passed through the plurality of openings of the aperture member, a blanking aperture member configured to block each of beams which were deflected to be in a beam off state by the plurality of blankers, a plural stage objective lens configured to focus multiple beams having passed through the blanking aperture member onto the target object, and a plurality of electrostatic lenses, at least one of which is arranged at each stage of the plural stage objective lens, configured to dynamically correct defocusing of the multiple beams during writing.

In accordance with another aspect of the present invention, a multi charged particle beam writing method includes focusing multiple beams, which were formed by letting a region including a whole of a plurality of openings of an aperture member be irradiated by a charged particle beam and letting parts of the charged particle beam respectively pass through a corresponding opening of the plurality of openings, onto a target object by using a plural stage objective lens, and correcting defocusing of the multiple beams dynamically, during writing, by using a plurality of electrostatic lenses, at least one of which is arranged at each stage of the plural stage objective lens.

BRIEF DESCRIPTION OF THE DRAWINGS

FIG. 9 shows an example of a rotation amount of an image when a variable voltage is applied to a two-stage electrostatic lens according to Embodiment 1;

FIGS. 10A and 10B are schematic diagrams explaining an example of the effect of a two-stage electrostatic lens according to Embodiment 1;

FIG. 12 shows an example of magnification change of an image when a variable voltage is applied to a two-stage electrostatic lens according to Embodiment 1;

FIGS. 13A and 13B are schematic diagrams explaining another example of the effect of a two-stage electrostatic lens according to Embodiment 1;

DETAILED DESCRIPTION OF THE INVENTION

In the following Embodiments, there will be described a structure in which an electron beam is used as an example of a charged particle beam. The charged particle beam is not limited to the electron beam, and other charged particle beam, such as an ion beam, may also be used.

Moreover, in the following Embodiments, there will be described an apparatus and a method capable of preventing at least one of rotation and magnification change of an image due to dynamic focusing.

Embodiment 1

Figure 1:
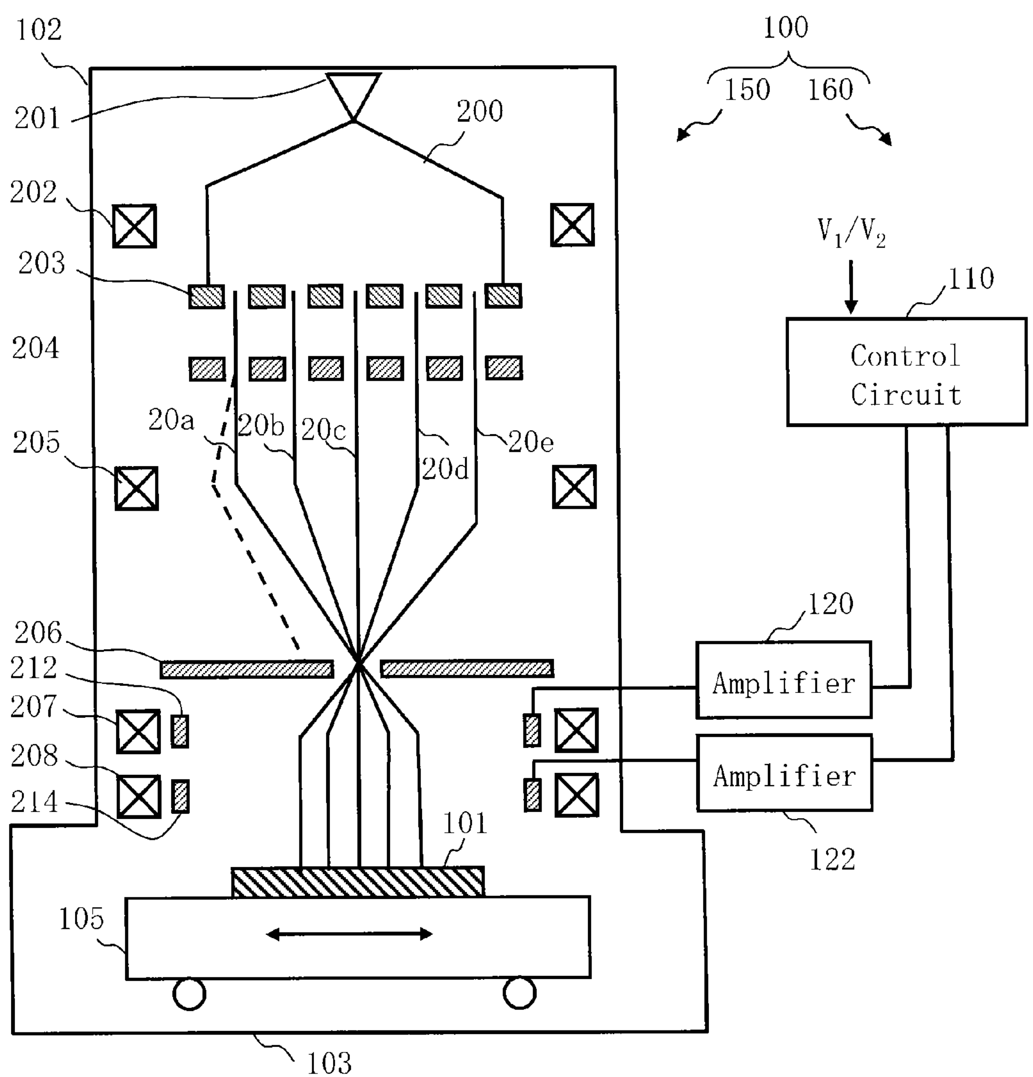
FIG. 1 is a schematic diagram showing the configuration of a writing apparatus according to Embodiment 1.

FIG. 1 is a schematic diagram showing an example of the configuration of a writing apparatus according to Embodiment 1. In FIG. 1, a writing (or "drawing") apparatus 100 includes a writing unit 150 and a control unit 160. The writing apparatus 100 is an example of a multi charged particle beam writing apparatus. The writing unit 150 includes an electron lens barrel 102 and a writing chamber 103. In the electron lens barrel 102, there are arranged an electron gun assembly 201, an illumination lens 202, an aperture member 203, a blanking plate 204, a reducing lens 205, a limiting aperture member 206, a two-stage objective lens composed of objective lenses 207 and 208, and a two-stage electrostatic lens composed of electrostatic lenses 212 and 214. In the writing chamber 103, there is arranged an XY stage 105, on which a target object or "sample" 101 such as a mask serving as a writing target substrate is placed during the writing. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed.

The controlling unit 160 includes a control circuit 110, and amplifiers 120 and 122. The control circuit 110, and the amplifiers 120 and 122 are mutually connected through a bus (not shown).

As described above, FIG. 1 shows a structure necessary for explaining Embodiment 1. Other structure elements generally necessary for the writing apparatus 100 may also be included.

Figure 2A:
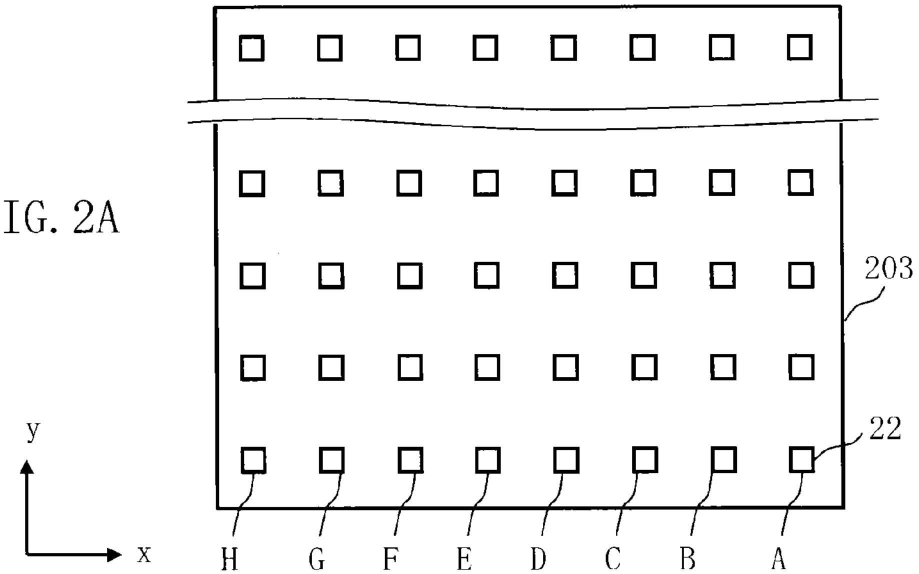
FIGS. 2A and 2B are schematic diagrams each showing the configuration of an aperture member according to Embodiment 1.
Figure 2B:
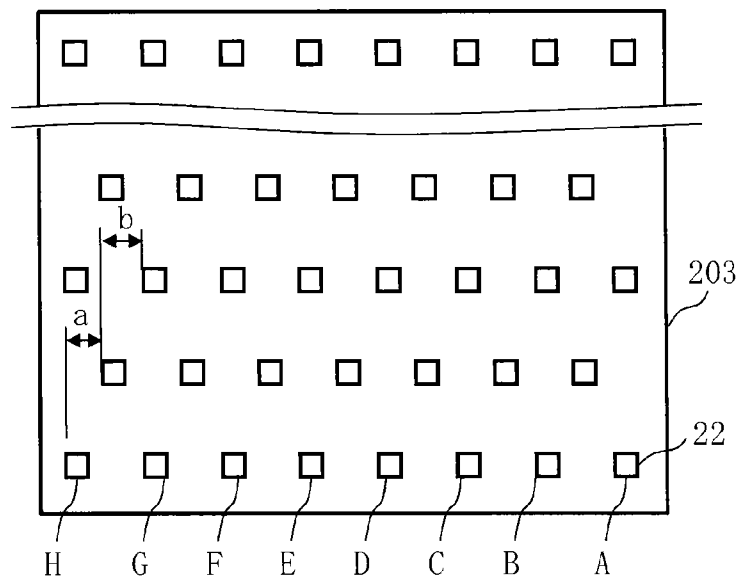

FIGS. 2A and 2B are schematic diagrams each showing an example of the configuration of an aperture member according to Embodiment 1. In FIG. 2A, holes (openings) 22 are formed in the shape of a matrix at a predetermined arrangement pitch in the aperture member 203, wherein m×n (m≥2, n≥2) holes 22 are in m columns in the vertical direction (the y direction) and in n rows in the horizontal direction (the x direction). In FIG. 2A, holes 22 of 512 (rows)×8 (columns) are formed, for example. Each hole 22 has the same dimensional shape of a quadrangle. Alternatively, each hole may be a circle of the same circumference. In this case, there is shown an example of each row having eight holes 22 from A to H in the x direction. Multi-beams 20 are formed by letting parts of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
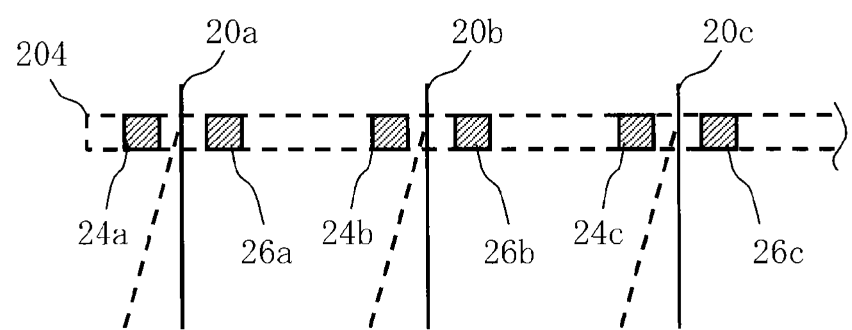
FIG. 3 is a schematic diagram showing the configuration of a blanking plate according to Embodiment 1.

FIG. 3 is a schematic diagram showing an example of the configuration of a blanking plate according to Embodiment 1. In the blanking plate 204, a passage hole is formed to be corresponding to the arrangement position of each hole 22 of the aperture member 203, and a pair of electrodes 24 and 26 (blanker: the first deflector) is arranged for each passage hole. The electron beams 20 (multiple beams) respectively passing through a corresponding passage hole are respectively deflected by the voltage applied to the two electrodes 24 and 26 being a pair, and blanking control is performed by this deflection. Thus, a plurality of blankers respectively perform blanking deflection of a corresponding beam in multiple beams having passed through a plurality of holes 22 (openings) of the aperture member 203.

The electron beam 200 emitted from the electron gun assembly 201 (emission unit) almost perpendicularly illuminates the whole of the aperture member 203 by the illumination lens 202. A plurality of holes (openings), each in the shape of a quadrangle, are formed in the aperture member 203. The region including all the plurality of holes is irradiated by the electron beam 200. For example, a plurality of rectangular electron beams (multiple beams) 20*a* to 20*e* are formed by letting parts of the electron beam 200 irradiating the positions of a plurality of holes pass through a corresponding hole of the plurality of holes of the aperture member 203 respectively. The multiple beams 20*a* to 20*e* respectively pass through a corresponding blanker (the first blanker) of the blanking plate 204. Each blanker deflects (performs blanking deflection) the electron beam 200 which passes respectively. The multiple beams 20*a*, 20*b*, 20*c*, . . . , having passed through the blanking plate 204 are reduced by the reducing lens 205, and go toward the hole at the center of the limiting aperture member 206. Here, the electron beam 20 which was deflected by the blanker of the blanking plate 204 deviates from the hole of the center of the limiting aperture member 206 (blanking aperture member) and is blocked by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam. Thus, the limiting aperture member 206 blocks each beam which was deflected to be in the "beam off" state by a plurality of blankers. Then, one shot of the beam is formed by beams which have been formed during from the "beam on" state to the "beam off" state and have passed through the limiting aperture member 206. The multi-beams 20 having passed through the limiting aperture member 206 are focused by the two-stage objective lens (objective lenses 207 and 208) to become a pattern image of a desired reduction ratio (magnification ratio) so as to irradiate respective irradiation positions on the target object 101. Moreover, for example, since the writing position changes each time while the XY stage 105 is continuously moving, the height on the target object surface, which is irradiated by the multi-beam 20, also changes. Then, defocus (focus deviation) of the multi-beam 20 is dynamically corrected (dynamic focusing) by the electrostatic lenses 212 and 214 during writing. Ideally, multi-beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be "beam on" according to a pattern.

Figure 4A:
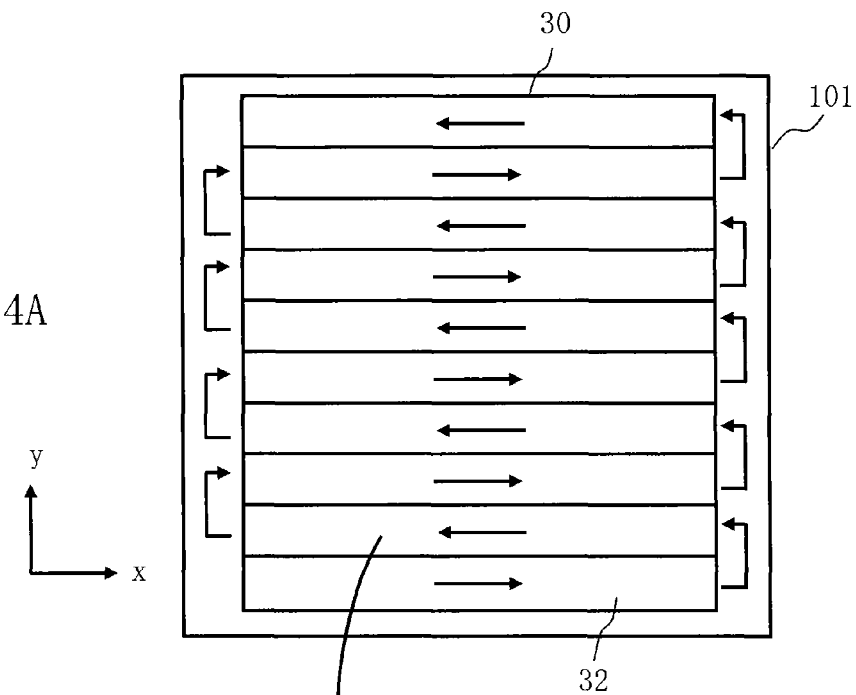
FIGS. 4A to 4C are schematic diagrams explaining a writing operation according to Embodiment 1.
Figure 4B:
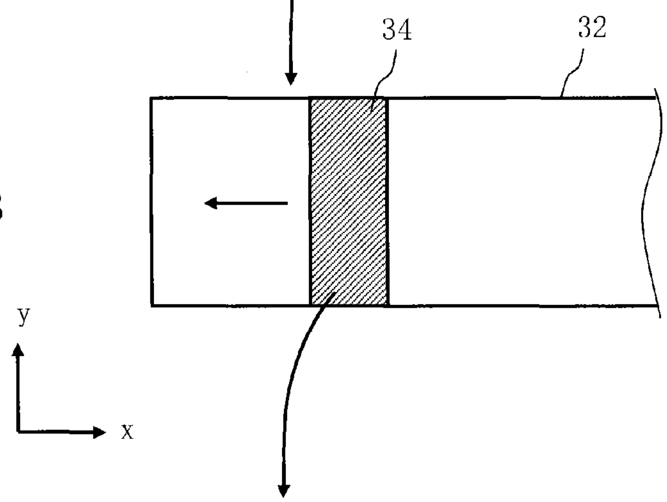
Figure 4C:
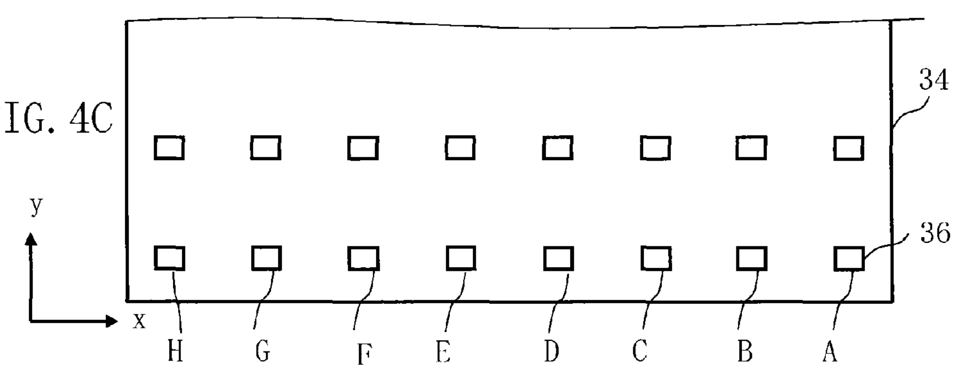

FIGS. 4A to 4C are schematic diagrams explaining a writing operation according to Embodiment 1. As shown in FIG. 4A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34 to be irradiated by one-time irradiation of the multi-beams 20 is located at the left end of the first stripe region 32 or at the further left position, and then writing is started. When writing the first stripe region 32, writing advances relatively in the x direction by moving the XY stage 105 in the −x direction, for example. The XY stage 105 is continuously moved at a predetermined rate, for example. After writing the first stripe region 32, the stage position is moved in the −y direction and adjusted such that the irradiation region 34 is located at the right end of the second stripe region 32 or at the further right position, namely, located to be relatively in the y direction. Then, similarly, as shown in FIG. 4B, writing advances in the −x direction by moving the XY stage 105 in the x direction, for example. Writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, as shown in FIG. 4C, a plurality of shot patterns 36 of the same number as the holes 22 are formed at a time by multiple beams which have been formed bypassing through respective corresponding holes 22 of the aperture member 203. For example, a beam which passed through one hole A of the aperture member 203 irradiates the position "A" shown in FIG. 4C and forms the shot pattern 36 at this position. Similarly, a beam which passed through one hole B of the aperture member 203 irradiates the position "B" shown in FIG. 4C and forms the shot pattern 36 at this position, for example. Hereafter, a similar operation is performed with respect to C to H. When writing each stripe 32 while the XY stage 105 is moved in the x direction, a deflector (not shown) performs deflection such that each shot moves (scans) in the y direction or in the x and y directions in order, thereby the writing operation is executed by a raster scan method of continuously delivering shot beam radiation in order.

Figure 5:
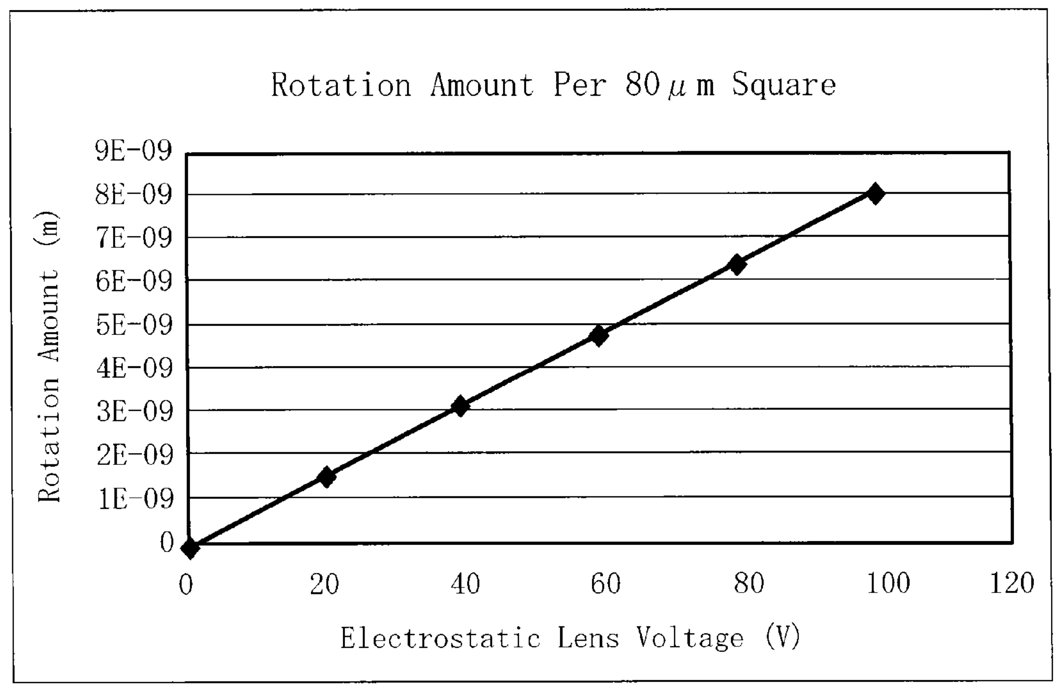
FIG. 5 shows an example of a rotation amount of an image due to dynamic focusing, as a comparative example of Embodiment 1.

FIG. 5 shows an example of a rotation amount of an image due to dynamic focusing, as a comparative example of Embodiment 1. For example, in the case of performing dynamic focusing by using only a one-stage electrostatic lens, when changing (increasing) a voltage applied to the electrostatic lens, the rotation amount also increases in accordance with the voltage change as shown in FIG. 5. FIG. 5 shows an example of the rotation amount at the corner of an irradiation region of 80 μm square. For example, when the voltage applied to an electrostatic lens is 40V, the rotation amount of an image is $3\times10^{-9}$ m, and when the voltage is 100V, the rotation amount of an image is $8\times10^{-9}$ m. Particularly, in the multi-beam system, since the number of beams of one shot which is simultaneously irradiating is a large number, the irradiation region of the multi-beam is large compared with the shot region of the single beam system. Therefore, if rotational displacement occurs in an irradiation region of the multi-beam, an irradiation positional deviation of each beam will become large. Needless to say, even in the single beam system, it is expected that this problem may be serious in the pursuit of further accuracy of writing from now on.

Figure 6:
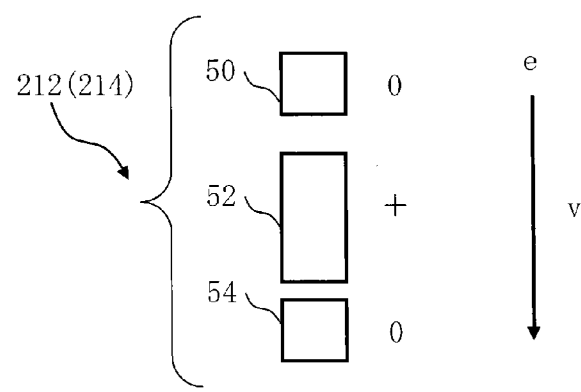
FIG. 6 shows an example of an electrostatic lens used for dynamic focusing according to Embodiment 1.

FIG. 6 shows an example of the electrostatic lens used for dynamic focusing according to Embodiment 1. Each of the electrostatic lenses 212 and 214 is configured, for example, by a three-stage electrode composed of three ring-shaped electrodes 50, 52, and 54. Then, dynamic focusing is performed by applying a voltage of 0V to the upper and the lower electrodes 50 and 54 and a positive voltage to the middle stage electrode 52, for example. Therefore, a velocity v of the electron which passes through the electrostatic lens 212 or 214 changes in accordance with the voltage variation. Here, the rotation amount θ of an image due to dynamic focusing can be defined by the following equation (1).

$$\theta \propto \int \frac{B}{v} dz \tag{1}$$

Thus, the rotation amount θ of the image due to dynamic focusing is proportional to a value obtained by integrating a value, which is calculated by dividing a magnetic field B by an electron moving velocity v, by a distance z along the optical axis. Then, according to Embodiment 1, the electrostatic lens for dynamic focusing is composed of two stages so that a rotation amount θ generated by one electrostatic lens (e.g., the electrostatic lens 212) may be cancelled out by a rotation amount θ generated by the other electrostatic lens (e.g., the electrostatic lens 214).

Figure 7:
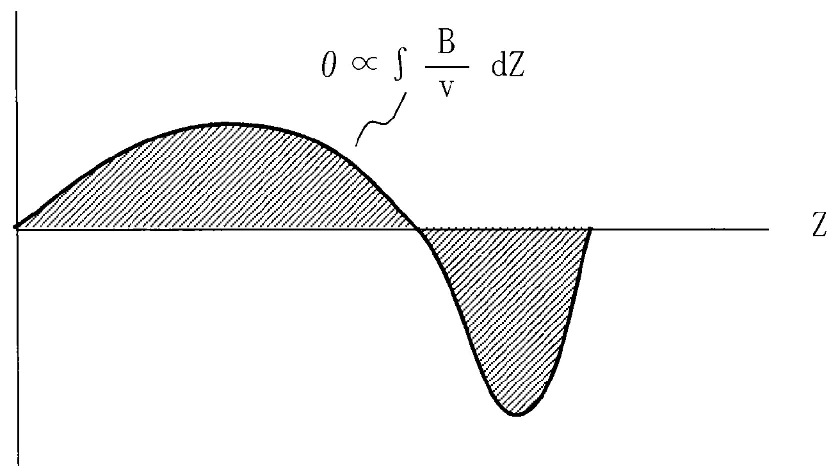
FIG. 7 shows an example of a rotation amount generated by a two-stage electrostatic lens according to Embodiment 1.

FIG. 7 shows an example of a rotation amount generated by the two-stage electrostatic lens according to Embodiment 1. In FIG. 7, the area of the region A shown in slash lines at the positive (+) side indicates, for example, a value (rotation amount) obtained by integrating a value, which is calculated by dividing a magnetic field B generated by the electrostatic lens 212 by an electron moving velocity v, by a distance z along the optical axis. On the other hand, the area of the region B shown in slash lines at the negative (−) side indicates, for example, a value (rotation amount) obtained by integrating a value, which is calculated by dividing a magnetic field B generated by the electrostatic lens 214 by an electron moving velocity v, by a distance z along the optical axis.

Figures 8A, 8B:
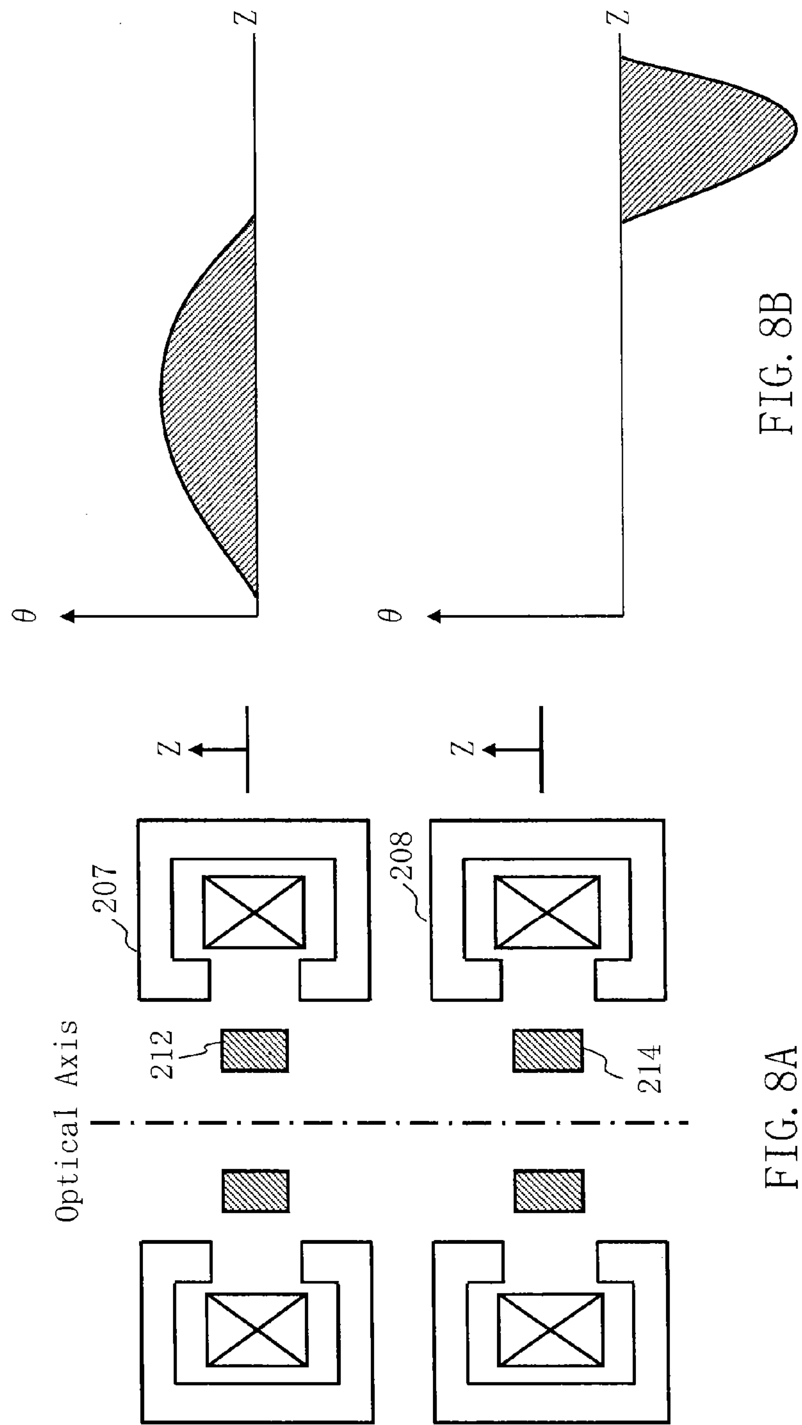
FIG. 8A shows a configuration of a two-stage objective lens and a two-stage electrostatic lens according to Embodiment 1.
FIG. 8B shows an example of a rotation amount according to Embodiment 1.

FIG. 8A shows a configuration of a two-stage objective lens and a two-stage electrostatic lens according to Embodiment 1, and FIG. 8B shows examples of the rotation amount.

As shown in FIG. 8A, the electrostatic lens 212 is arranged at the center of the magnetic field of the objective lens 207 being an electromagnetic lens. Moreover, the electrostatic lens 214 is arranged at the center of the magnetic field of the objective lens 208 being an electromagnetic lens. Although the electrostatic lenses 212 and 214 are respectively arranged at the center of the magnetic field in this case, it is not limited thereto. They may be arranged appropriately shifted in terms of the vertical direction. As to the arrangement height position of each electrostatic lens, it is desirable to be close to the center of the magnetic field as much as possible, and what is necessary is to be a position overlapping, even partly, with the objective lens in terms of the vertical direction. In FIG. 8, the area of the region A shown in slash lines at the positive (+) side indicates, for example, a value (rotation amount) obtained by integrating a value, which is calculated by dividing a magnetic field B generated by the electrostatic lens 212 by an electron moving velocity v, by a distance z along the optical axis. On the other hand, the area of the region B shown in slash lines at the negative (−) side indicates, for example, a value (rotation amount) obtained by integrating a value, which is calculated by dividing a magnetic field B generated by the electrostatic lens 214 by an electron moving velocity v, by a distance z along the optical axis. If it is possible to make the areas of the regions A and B the same value with reversed sign (+, −), the rotation of the image can be cancelled out with each other. According to Embodiment 1, voltages to be applied are adjusted each other so that the areas of the regions A and B may be the same value with reversed sign. Thereby, the rotation of an image due to dynamic focusing can be rotation-free.

FIG. 9 shows an example of a rotation amount of an image when a variable voltage is applied to a two-stage electrostatic lens according to Embodiment 1. This example shows the case where when a voltage of 100V is applied to the first stage electrostatic lens 212, the voltage to be applied to the second stage electrostatic lens 214 is made to be variable, for example. In the case of FIG. 9, for example, when a voltage of 83V is applied to the second stage electrostatic lens 214, the rotation amount becomes 0 (rotation change angle being 0°). Therefore, it is possible to make the rotation of an image due to dynamic focusing be rotation-free by performing voltage adjustment so that the voltage may be interlocked such that the voltage ratio V1/V2 between the voltage V1 applied to the first stage electrostatic lens 212 and the voltage V2 applied to the second stage electrostatic lens 214 is always maintained.

Then, the voltage ratio through which rotation of an image due to dynamic focusing can be rotation-free is calculated in advance by simulation or experiment, etc. and the calculated voltage ratio is set in the control circuit 110. Then, at the time of writing, the voltage V1 applied to the first stage electrostatic lens 212 and the voltage V2 applied to the second stage electrostatic lens 214 are controlled so that such a voltage ratio between V1 and V2 may be maintained. By virtue of this structure, it is possible to make a multi-beam image have no rotation on the target object surface. A digital signal output from the control circuit 110 is converted to an analog signal (voltage) by the amplifier 120 and applied as a control voltage V1 to the first stage electrostatic lens 212. A digital signal output from the control circuit 110 is converted to an analog signal (voltage) by the amplifier 122 and applied as a control voltage V2 to the second stage electrostatic lens 214.

FIGS. 10A and 10B are schematic diagrams explaining an example of the effect of a two-stage electrostatic lens according to Embodiment 1. In the single beam system, as shown in FIG. 10A, since the irradiation region is a shot FIG. 11 of one beam, a gyration radius r0 is small. Therefore, even when rotation due to dynamic focusing is generated, the positional error is to be small. On the other hand, in the multi-beam system, as shown in FIG. 10B, since multiple shot figures 36 are irradiated by a large number of beams of one shot, an irradiation region 10 is large. Therefore, a gyration radius r1 is large in accordance with the irradiation region. Accordingly, if a rotation due to dynamic focusing is generated, since the whole of the irradiation region 10 rotates, the positional deviation amount of each shot FIG. 36 also becomes large. Then, according to Embodiment 1, it is possible to inhibit such positional deviation by arranging a two-stage electrostatic lens to cancel out rotation of an image. In particular, the effect is large in the multi-beam system.

In the example described above, correcting rotation of an image due to dynamic focusing has been explained, and however, instead of that, it is also acceptable to correct magnification change of an image due to dynamic focusing.

Figure 11:
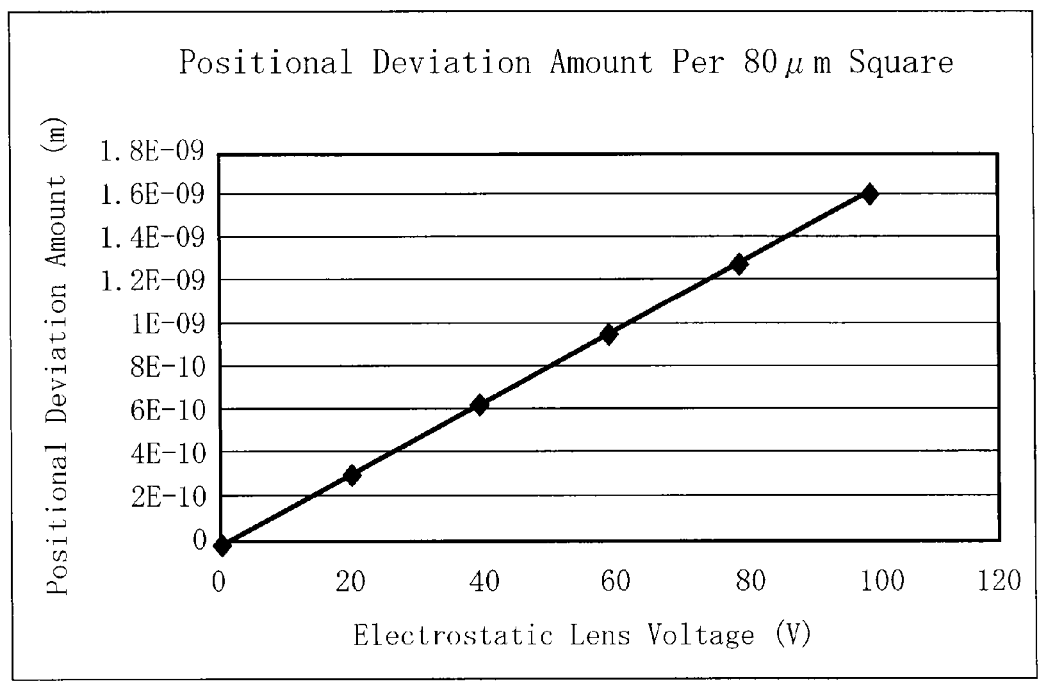
FIG. 11 shows an example of magnification change of an image due to dynamic focusing, as a comparative example of Embodiment 1.

FIG. 11 shows an example of magnification change of an image due to dynamic focusing, as a comparative example of Embodiment 1. For example, in the case of performing dynamic focusing by using only a one-stage electrostatic lens, when changing (increasing) a voltage applied to the electrostatic lens, the positional deviation amount associated with magnification change also increases in accordance with the voltage change as shown in FIG. 11. FIG. 11 shows an example of a positional deviation amount associated with the magnification change at the corner of an irradiation region of 80 μm square. For example, when the voltage applied to an electrostatic lens is 60V, the positional deviation amount of an image is $1\times10^{-9}$ m, and when the voltage is 100V, the positional deviation amount of an image is $1.65\times10^{-9}$ m. Particularly, in the multi-beam system, since the number of beams of one shot which are simultaneously irradiating is a large number, the irradiation region of the multi-beam is large compared with the shot region of the single beam system. Therefore, if magnification change occurs in an irradiation region of the multi-beam, an irradiation positional deviation of each beam will become large. Needless to say, even in the single beam system, it is expected that this problem may be serious in the pursuit of further accuracy of writing from now on.

FIG. 12 shows an example of magnification change of an image when a variable voltage is applied to a two-stage electrostatic lens according to Embodiment 1. This example shows the case where when a voltage of 100V is applied to the first stage electrostatic lens 212, the voltage to be applied to the second stage electrostatic lens 214 is made to be variable, for example. In the case of FIG. 12, for example, when a voltage of 27V is applied to the second stage electrostatic lens 214, the magnification change becomes 0 (magnification change rate being 1). Therefore, it is possible to let the magnification change of an image due to dynamic focusing not be generated, by performing voltage adjustment so that voltage may be interlocked such that the voltage ratio V1/V2 between the voltage V1 applied to the first stage electrostatic lens 212 and the voltage V2 applied to the second stage electrostatic lens 214 is always maintained.

Then, the voltage ratio through which magnification change of an image due to dynamic focusing is not generated is calculated in advance by simulation or experiment, etc. and the calculated voltage ratio is set in the control circuit 110. Then, at the time of writing, the voltage V1 applied to the first stage electrostatic lens 212 and the voltage V2 applied to the second stage electrostatic lens 214 are controlled so that such a voltage ratio between V1 and V2 may be maintained. By virtue of this structure, it is possible to make a multi-beam image have no magnification change on the target object surface.

FIGS. 13A and 13B are schematic diagrams explaining another example of the effect of a two-stage electrostatic lens according to Embodiment 1. In the single beam system, as shown in FIG. 13A, since the irradiation region is the shot FIG. 11 of one beam, even when magnification change due to dynamic focusing is generated, the positional error is to be small. On the other hand, in the multi-beam system, as shown in FIG. 13B, since the multiple shot figures 36 are irradiated by a large number of beams of one shot, the irradiation region 10 is large. Accordingly, if magnification change due to dynamic focusing is generated, since magnification of the whole of the irradiation region 10 changes, the positional deviation amount of each shot FIG. 36 also becomes large when the same magnification change as that of the single beam system occurs. Then, according to Embodiment 1, it is possible to inhibit such positional deviation by arranging a two-stage electrostatic lens to cancel out magnification change of an image. In particular, the effect is large in the multi-beam system.

As described above, according to Embodiment 1, at least one of rotation and magnification change of an image due to dynamic focusing can be inhibited.

Embodiment 2

Although in Embodiment 1 there has been described a structure in which either one of rotation and magnification change of an image due to dynamic focusing is corrected, there will be described in Embodiment 2 a structure in which both of them are corrected.

Figure 14:
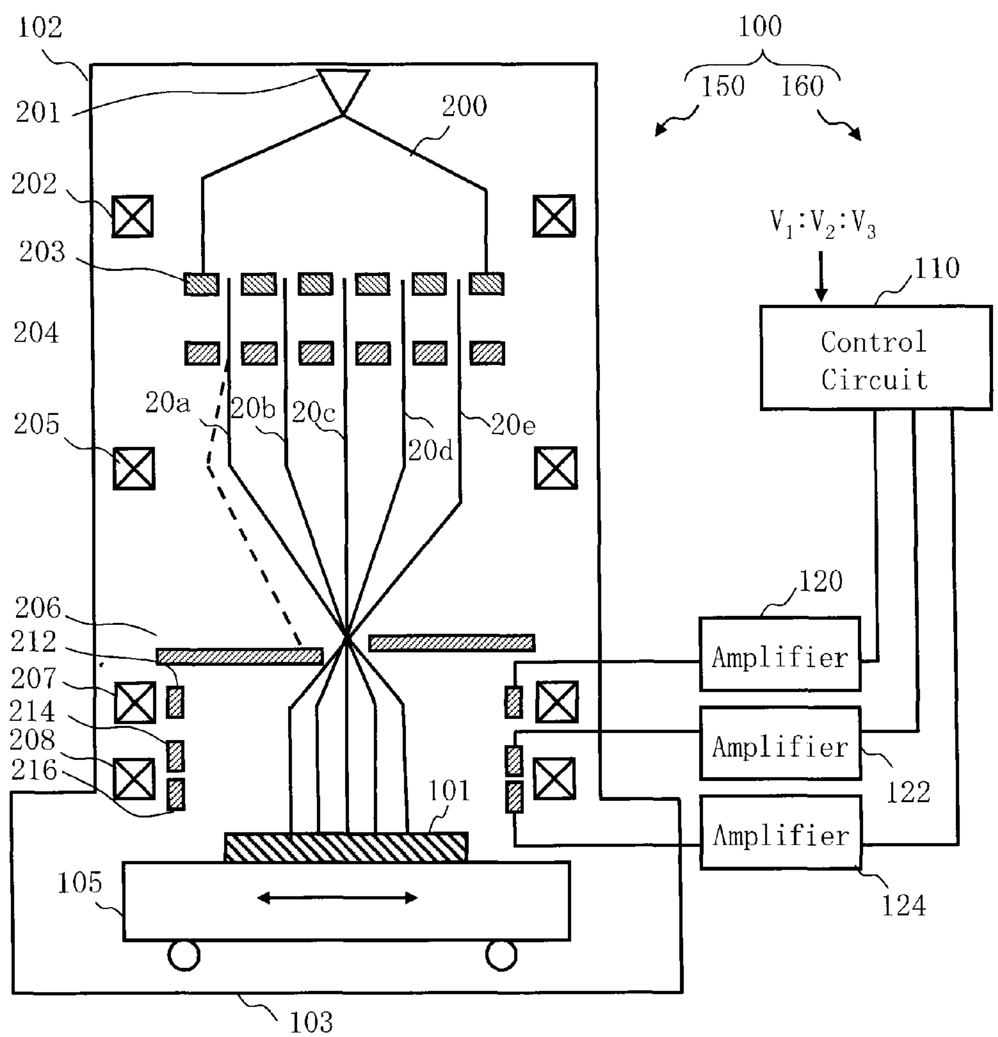
FIG. 14 is a schematic diagram showing the configuration of a writing apparatus according to Embodiment 2.

FIG. 14 is a schematic diagram showing an example of the configuration of a writing apparatus according to Embodiment 2. FIG. 14 is the same as FIG. 1 except that a three-stage electrostatic lens composed of electrostatic lenses 212, 214, and 216 is arranged instead of the two-stage electrostatic lens of lenses 212 and 214 and an amplifier 124 for the third stage electrostatic lens 216 is added. Moreover, the content of Embodiment 2 is the same as that of Embodiment 1 except what is particularly described below. In FIG. 14, the electrostatic lens 212 is arranged near the center of the magnetic field of the objective lens 207 and the electrostatic lenses 214 and 216 of two stages are arranged near the center of the magnetic field of the objective lens 208. As to the arrangement height position of each electrostatic lens, it is desirable to be close to the center of the magnetic field as much as possible, and what is necessary is to be a position overlapping, even partly, with the objective lens in terms of the vertical direction.

Figure 15:
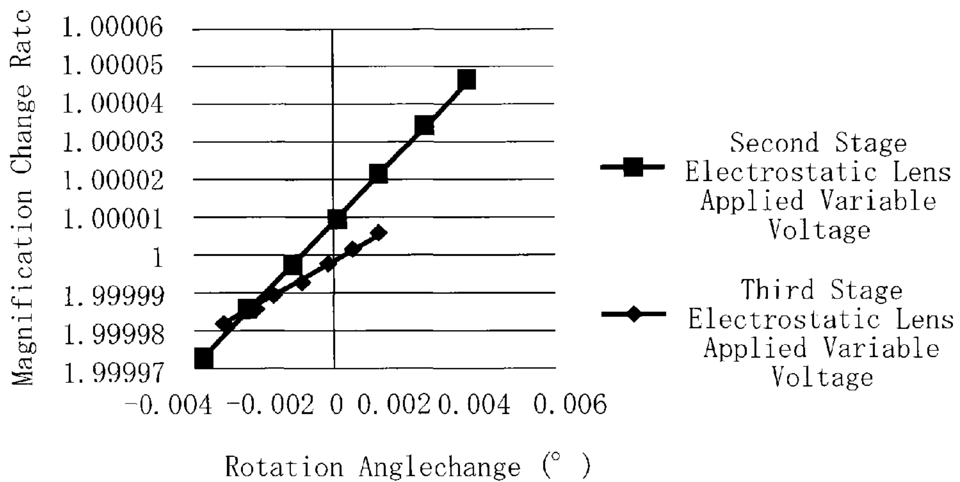
FIG. 15 shows an example of rotation and magnification change of an image when a variable voltage is applied to a three-stage electrostatic lens according to Embodiment 2.

FIG. 15 shows an example of rotation and magnification change of an image when a variable voltage is applied to a three-stage electrostatic lens according to Embodiment 2. This example shows the case where when a voltage of 100V is applied to the first stage electrostatic lens 212, the voltage V2 to be applied to the second stage electrostatic lens 214 and the voltage V3 to be applied to the third stage electrostatic lens 216 are made to be variable, for example.

Then, although not shown in FIG. 15, the combination of the three voltages V1, V2 and V3 through which rotation of an image due to dynamic focusing becomes rotation-free and magnification change of an image due to dynamic focusing is not generated is calculated by simulation or experiment, etc., the voltage ratio of such three voltages V1, V2, and V3 is calculated to be set in the control circuit 110. Voltage adjustment is performed such that voltage is interlocked so that such a voltage ratio of V1:V2:V3 of the voltage V1 to be applied to the first stage electrostatic lens 212, the voltage V2 to be applied to the second stage electrostatic lens 214, and the voltage V3 to be applied to the third stage electrostatic lens 216 may always be maintained. A digital signal output from the control circuit 110 is converted to an analog signal (voltage) by the amplifier 120 to be applied as the control voltage V1 to the first stage electrostatic lens 212. A digital signal output from the control circuit 110 is converted to an analog signal (voltage) by the amplifier 122 to be applied as the control voltage V2 to the second stage electrostatic lens 214. A digital signal output from the control circuit 110 is converted to an analog signal (voltage) by the amplifier 124 to be applied as the control voltage V3 to the third stage electrostatic lens 216.

As described above, according to Embodiment 2, both the rotation and magnification change of an image due to dynamic focusing can be prevented from being generated.

Although the three-stage electrostatic lens is used in Embodiment 2, it is not limited thereto, and what is necessary is to use three or more stage electrostatic lens. The example of FIG. 14 shows the structure in which the electrostatic lens 212 is arranged near the center of the magnetic field of the objective lens 207, and the electrostatic lenses 214 and 216 of two stages are arranged near the center of the magnetic field of the objective lens 208. However, any either one of the objective lenses 207 and 208 may be provided with electrostatic lenses of a plurality of stages. Alternatively, it is also acceptable to arrange electrostatic lenses of a plurality of stages at both the objective lenses.

Embodiments have been explained referring to concrete examples described above. However, the present invention is not limited to these specific examples. The raster scanning operation described above is just an example, and it is also acceptable to use other operation method instead of the raster scanning operation using multiple beams.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:

a stage configured to mount a target object thereon and be movable continuously;

an emission unit configured to emit a charged particle beam;

an aperture member, including a plurality of openings, configured to form multiple beams by receiving the charged particle beam at a region including a whole of the plurality of openings and letting parts of the charged particle beam respectively pass through a corresponding opening of the plurality of openings;

a blanking plate including a plurality of blankers configured to respectively perform blanking deflection of a corresponding beam of the multiple beams having passed through the plurality of openings of the aperture member;

a blanking aperture member configured to block each of the multiple beams which were deflected to be in a beam off state by the plurality of blankers;

a plural stage objective lens configured to focus the multiple beams having passed through the blanking aperture member onto the target object;

three electrostatic lenses, at least one of which is arranged at each respective stage of the plural stage objective lens, configured to dynamically correct defocusing of the multiple beams during a writing; and a control circuit configured to control respective voltages V1, V2, V3 applied to the three electrostatic lenses, configured to set a previously calculated voltage ratio V1:V2:V3, and configured to control the voltages V1, V2, V3 applied to the respective three electrostatic lenses to maintain the set voltage ratio V1:V2:V3.

2. The apparatus according to claim 1, wherein the plural stage objective lens includes first and second stages, two of the three electrostatic lenses are arranged at the first stage of the plural stage objective lens and one of the three electrostatic lenses is arranged at the second stage of the plural stage objective lens.

3. The apparatus according to claim 1, wherein each of the plurality of electrostatic lenses includes a three-stage electrode composed of three electrodes.

4. The apparatus according to claim 3, wherein a voltage of 0V is applied to upper and lower electrodes of the three-stage electrode and a positive voltage is applied to a middle electrode of the three-stage electrode.

5. The apparatus according to claim 1, wherein each of the plurality of electrostatic lenses is arranged near a center of a magnetic field of one objective lens of the plural stage objective lens.

6. A multi charged particle beam writing method comprising:

focusing multiple beams, formed by receiving a charged particle beam at a region including a whole of a plurality of openings of an aperture member and letting parts of the charged particle beam respectively pass through a corresponding opening of the plurality of openings, onto a target object by using a plural stage objective lens;

correcting defocusing of the multiple beams dynamically, during writing, by using three electrostatic lenses, at least one of which is arranged at each stage of the plural stage objective lens; and controlling respective voltages V1, V2, V3 applied to the three electrostatic lenses, by a control circuit configured to set a previously calculated voltage ratio V1:V2:V3, and controlling the voltages V1, V2, V3 applied to the respective three electrostatic lenses to maintain the set voltage ratio V1:V2:V3.

7. The method according to claim 6, wherein the plural stage objective lens includes first and second stages, two of the three electrostatic lenses are arranged at the first stage of the plural stage objective lens and one of the three electrostatic lenses is arranged at the second stage of the plural stage objective lens.

8. The apparatus according to claim 2, wherein each of the three electrostatic lenses is arranged near a center of a magnetic field of a corresponding objective lens of the plural stage objective lens.

* * * * *